US006185129B1

United States Patent
Seo

(10) Patent No.: US 6,185,129 B1
(45) Date of Patent: Feb. 6, 2001

(54) POWER RESET CIRCUIT OF A FLASH MEMORY DEVICE

(75) Inventor: Sung Hwan Seo, Seoul (KR)

(73) Assignee: Hyundai Electronics Industries Co., Ltd., Kyungki-do (KR)

(*) Notice: Under 35 U.S.C. 154(b), the term of this patent shall be extended for 0 days.

(21) Appl. No.: 09/468,934

(22) Filed: Dec. 22, 1999

(30) Foreign Application Priority Data

Dec. 29, 1998 (KR) .................................. 98-60315

(51) Int. Cl.[7] .................................. G11C 16/04
(52) U.S. Cl. ............... 365/185.18; 365/226; 365/189.09
(58) Field of Search ..................... 365/185.18, 226, 365/189.09, 189.11, 194, 189.05

(56) References Cited

U.S. PATENT DOCUMENTS

| 4,746,822 | 5/1988 | Mahoney | 307/594 |
|---|---|---|---|
| 5,455,794 | * 10/1995 | Javanifard et al. | 365/185.18 |
| 5,552,725 | 9/1996 | Ray et al. | 327/143 |
| 5,578,951 | 11/1996 | Lee et al. | 327/143 |
| 5,778,238 | 7/1998 | Hofhine | 395/750.08 |
| 5,898,635 | 4/1999 | Raad et al. | 365/226 |
| 5,917,255 | 6/1999 | Ciccone | 307/130 |
| 5,930,129 | 7/1999 | Sugimura | 636/49 |

FOREIGN PATENT DOCUMENTS

| 6-296125 | 10/1994 | (JP) . |
|---|---|---|
| 7-262781 | 10/1995 | (JP) . |
| 8-187724 | 7/1996 | (JP) . |
| 9-258852 | 10/1997 | (JP) . |

* cited by examiner

Primary Examiner—David Nelms
Assistant Examiner—David Lam
(74) Attorney, Agent, or Firm—Pennie & Edmonds LLP

(57) ABSTRACT

There is disclosed a power reset circuit of a flash memory device, which is characterized in that it comprises a first bootstrap circuit for raising the voltage level of a first node into a higher level upon a power-up; a latch means for inverting the voltage level of said first node; a voltage detector operable depending on the output of said latch means, for outputting a low level or a high level of signal depending on the level of the supply voltage; a second bootstrap circuit for raising the voltage level of a second node into a high level upon a power-up; a delay means for delaying and outputting the voltage level of said second node, a transfer means operable depending on the output of said delay means, for transferring the output of said voltage detector; and a feedback means for feedbacking the output of said voltage detector to said first node and said second node.

9 Claims, 4 Drawing Sheets

US 6,185,129 B1

POWER RESET CIRCUIT OF A FLASH MEMORY DEVICE

FIELD OF THE INVENTION

1. Field of the Invention

The present invention relates to a power reset circuit of a flash memory device. In particular, the present invention relates to a power reset circuit of a flash memory device which can feed back the output of the power reset circuit to remove a standby current, thus improving the integration degree of a device.

2. Description of the Prior Art

Upon an initial operation of the flash memory device, respective components of the device has to maintain an initial set value so that they can perform a normal operation. Therefore, in the operation of the flash memory device, it is important to initiate (or reset) the device.

The power reset circuit performs the finction of initializing the device. Generally, the standby current of the flash memory device is limited within about 5 $\mu A$. Therefore, upon power-up, after the devices are initialized, the power reset circuit does not have to consume any current.

A conventional power reset circuit will be explained by reference to FIG. 1.

FIG. 1 is a circuit diagram for illustrating a conventional power reset circuit.

A delay section 11 for delaying the increase of the supply voltage is connected between the supply terminal Vcc and the first node K1, and a fourteenth NMOS transistor N14 the gate of which is connected to the first node K1 is connected between the first node K1 and tie supply terminal Vcc.

In the delay section 11, a plurality of PMOS transistors P101 to P112 the gates of which are connected to the ground terminal Vss, respectively, are serially connected between the supply terminal Vcc and the second node K2, and a plurality of PMOS transistors P113 to P132 the gates of which are connected to the ground terminal Vss, respectively, are serially connected between the second node K2 and the third node K3. Also, a first capacitor C1 consisted of NMOS transistors is connected between the third node K3 and the ground terminal Vss. A resistor R is connected between the fourteenth NMOS transistor N14 and the fourth node K4 and a fifteenth transistor N15 the gate of which is connected to the fourth node K4, is connected between the fourth node K4 and the supply terminal Vcc.

Further first and second inverters I2 and I3 are connected between the supply terminal Vcc and the ground terminal Vss, respectively. In the first inverter I2, a first PMOS transistor P1 the gate of which is connected to the fourth node K4, a PMOS transistor P2 and a third PMOS transistor P3 the gate of which is connected to the ground terminal Vss are serially connected between the supply terminal Vcc and the fifth node K5. Also, the first to fifth NMOS transistors N1 to N5 the gates of which are connected to the supply terminal Vcc are serially connected between the fifth node K5 and the ground terminal Vss.

In the second inverter I3, a fourth PMOS transistor P4 the gate of which is connected to the fourth node K4 a fifth PMOS transistor P5 the gate of which is connected to the ground terminal Vss are serially connected between the supply terminal Vcc and the sixth node K6. Seventh to ninth NMOS transistors N7 to N9 the gates of which are connected to the fifth node K5 are connected between the sixth node K6 and the ground terminal Vss.

Also, the sixth NMOS transistor N6 the gate of which is connected to the fifth node KS is connected the supply terminal Vcc and the fifth node K5, and a second capacitor C2 consisted of the NMOS transistors is connected between the fifth node K5 and the ground terminal Vss. The first to sixth inverters I1 to I6 are serially connected between the sixth node and the output terminal PURST, and a third capacitor C3 consisted of the PMOS transistors is connected between the supply terminal Vcc and the sixth node K6. Also, tenth to thirteenth NMOS transistors N10 to N13 the gates of which are connected to the fourth node K4, respectively, are serially connected between the sixth node K6 and the ground terminal Vss. NMOS transistors N7 to N9 gates of which are connected to the fifth node K5 are connected between the ground terminal and the sixth node K6.

The operation of the power reset circuit constructed as above may be explained by dividing three steps as the supply voltage thereof increases from 0V to Vcc slowly.

First, the initial state in which the supply voltage is applied will be explained.

At initial state, the voltage level of the fourth node K4 being an input terminal of the first inverter I1 is maintained at low level. Thereby, the first PMOS transistor P1 is turned on and the supply voltage is applied to the fifth node K5 via the second and third PMOS transistors P2 and P3. At this time, as a low voltage level of the initial state is applied to the gates of the first to fifth NMOS transistors N1 to N5, the first to fifth NMOS transistors N1 to N5 are kept turned off. At the same time, the fourth PMOS transistor P4 will be turned on by the voltage level of the fourth node K4 being an input terminal of the second inverter I2, and thereby the supply voltage is applied to the sixth node K6 via the fifth PMOS transistor P5. Then, as the voltage level of the sixth node K6 is higher than that of the fifth node K5, the seventh to ninth NMOS transistors N7 to N9 are kept turned off Also, as the voltage level of the supply voltage is at low level, the sixth node K6 is kept at a low level. Accordingly, a low level of voltage is outputted via the output terminal PURST.

Second, the case that the supply voltage is maintained more than a constant level will be explained.

In this case, as the supply voltage is not so higher enough to turn on the NMOS transistor, a constant increased supply voltage is applied to the fifth node K5, Also, a constant increased supply voltage is applied to the sixth node K6. However, as the voltage level of the sixth node K6 is higher than that of the fifth node K5, a high level of voltage is outputted by the second bootstrap circuit 29 via the output terminal PURST and the initial operation for the device is accomplished.

Third, the state in which the supply voltage is completely increased will be explained.

After the supply voltage becomes a constant level to accomplish the initial operation, when a high level of voltage is outputted via the first node K1 being the output terminal of the delay section 11, the first and fourth PMOS transistors P1내지 P4 will be turned off and the tenth to thirteenth AMOS transistors N10 to N13 will be turned on, thus making the sixth node K6 a low level. Therefore, the operation of the first and second inverters I1 and I2 will stop and a low level of voltage will be outputted via tle output terminal PURST, thus stopping the initial operation.

The fourteenth and fifteenth NMOS transistors N14 and N15 are consisted of transistors having a low threshold voltage, i. e, about 0.3V than a different transistor. In this case, if the supply voltage is lowered to 0V, it functions to lower the voltage level of the fourth node K4 to 0V.

However, in the conventional power reset circuit, as the delay section 11 for delaying the increase of the supply voltage upon power-up is consisted of a plurality of PMOS transistors P101 to P132 and a capacitor C1, the area in which the power reset circuit occupies in the flash memory device is large. Also, if the power-up time is too long, the delay section 11 does not operate corresponding to the long power-up time.

SUMMARY OF THE INVENTION

It is an object of the present invention to solve the problems involved in the prior art, and to provide a power reset circuit of a flash memory device which can feed back the output value of the power reset circuit to remove a standby current, thus improving the integration degree of a device.

In order to accomplish the above object, the power reset circuit of the flash memory device according to the present invention is characterized in that it comprises a first bootstrap circuit for raising the voltage level of a first node into a higher level upon a power-up; a latch means for inverting the voltage level of said first node; a voltage detector operable depending on the output of said latch means, for outputting a low level or a high level of signal depending on the level of the supply voltage; a second bootstrap circuit for raising the voltage level of a second node into a higher level upon a power-up; a delay means for delaying and outputting the voltage level of said second node; a transfer means operable depending on the output of said delay means, for transferring the output of said voltage detector; and a feedback means for feedbacking the output of said voltage detector to said first node and said second node.

BRIEF DESCRIPTION OF THE DRAWINGS

The above object, and other features and advantages of the present invention will become more apparent by describing the preferred embodiment thereof with reference to the accompanying drawings, in which.

DETAILED DESCRIPTION OF PREFERRED EMBODIMENT

One preferred embodiment of the present invention will be explained by reference to the accompanying drawings.

Figure 1:
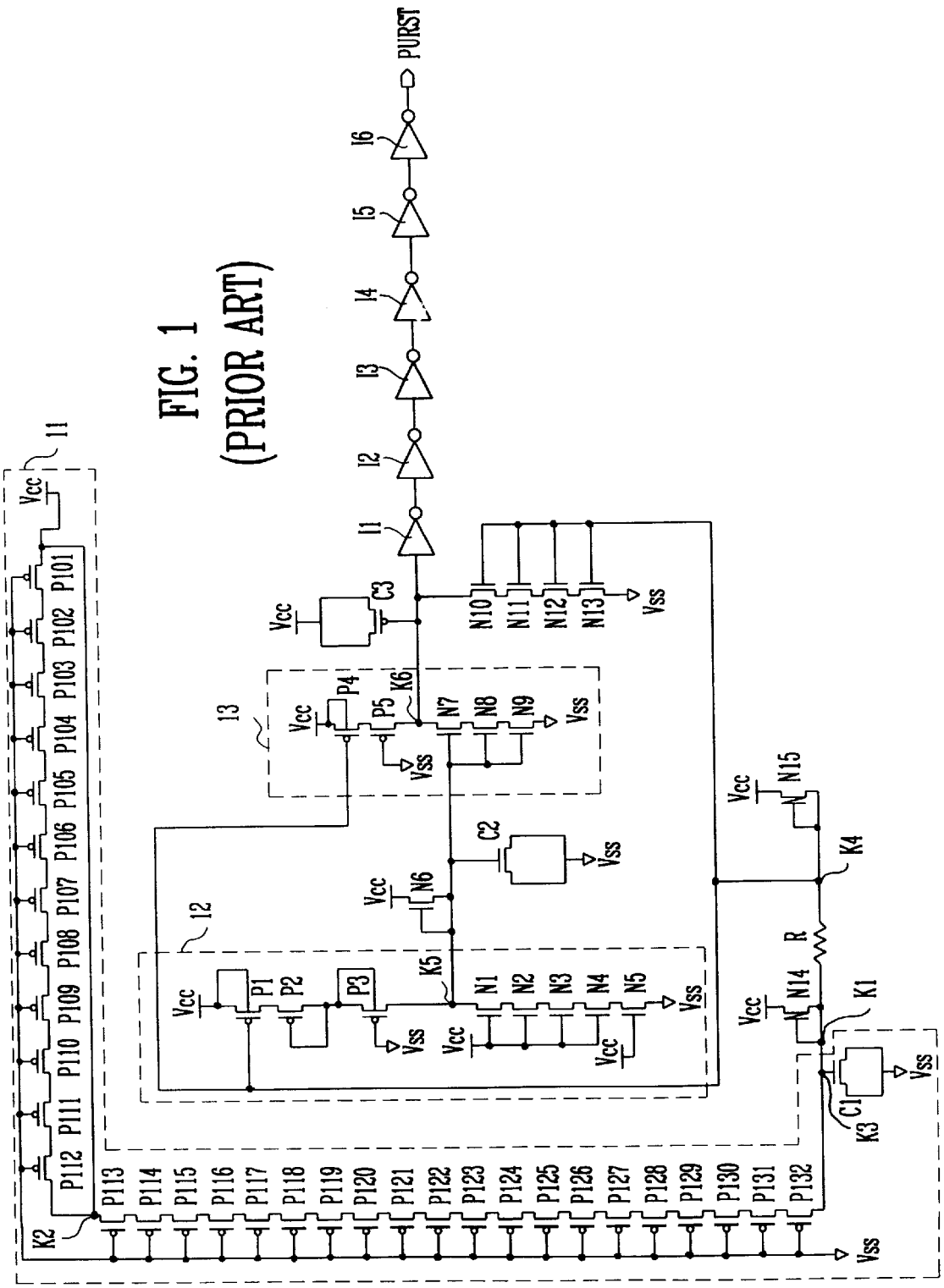
FIG. 1 is a circuit diagram for illustrating a conventional power reset circuit.
Figure 2:
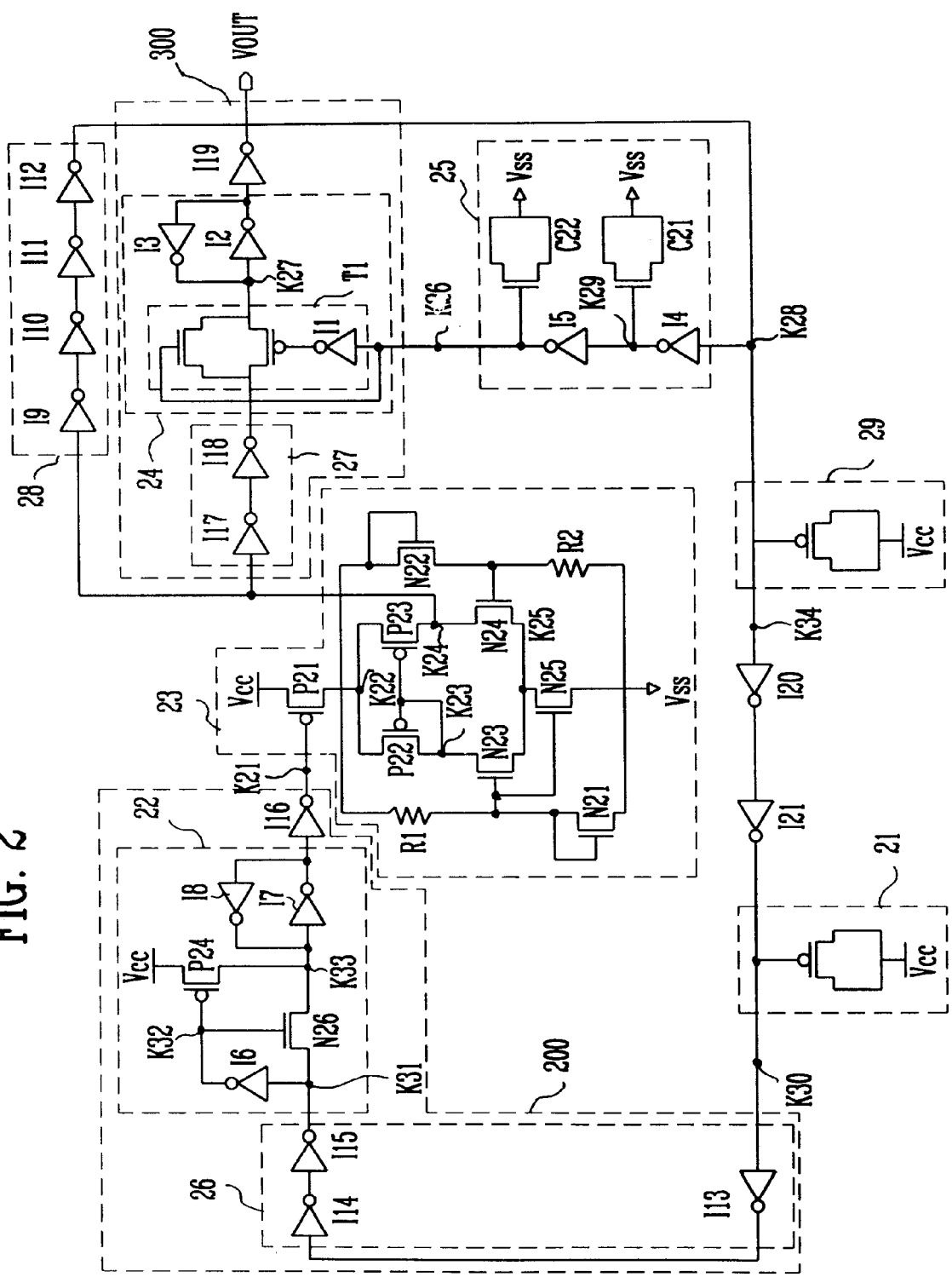
FIG. 2 is a circuit diagram for illustrating a power reset circuit according to the present invention.

FIG. 2 is a circuit diagram for illustrating a power reset circuit according to the present invention.

In FIG. 2, a first bootstrap circuit 21 is connected to a tenth node K30 and a latch means 200 is connected between the tenth node K30 and the first node K21, wherein the latch means 200 is consisted of serially connecting a first inverter 26, a second inverter 22 and a sixteenth inverter I16 of a third inverter.

The first inverter 26 is consisted of serially connecting the thirteenth to fifteenth inverters I13 to I15.

In the second inverter 22, the sixth inverter I6 is connected between the eleventh node K31 and the twelfth node K32, and a sixth NMOS transistor N26 the gate of which is connected to the twelfth node K32 is connected between the eleventh node K31 and the thirteenth node K33. Also, a fourth PMOS transistor P24 the gate of which is connected to the twelfth node K32 is connected between the supply terminal Vcc and the thirteenth node K33, and a pair of latches consisted of a pair of inverters I7 ad I8 and the sixteenth inverter I16 is connected between the thirteenth node K33 and the first node K21.

A voltage detector 23 for outputting a high level of voltage below a given voltage is connected between the supply terminal Vcc and the ground terminal Vss.

In the voltage detector 23, the first PMOS transistor P21 the gate of which is connected to the first node K21 being an input terminal of the voltage detector 23 is connected between the supply terminal Vcc and the second node K22. Also, the first resistor R1 and the first NMOS transistor N21 is serially connected between the second node K22 and the ground terminal Vss, while the second NMOS transistor N22 and the second resistor R2 are serially connected.

The second PMOS transistor P22 the gate of which is connected to the third node K23 is connected between the second node K22 and the third node K23, and the third PMOS transistor P23 the gate of which is connected to the third node K23 is connected between the second node K22 and the fourth node K24. A third NMOS transistor N23 the gate of which is connected the connecting point of the first resistor R1 and the first NMOS transistor N21 is connected between the third node K23 and the fifth node K25, and a fourth NMOS transistor N24 the gate of which is connected the connecting point of the second NMOS transistor N22 and the second resistor R2 is connected between the fourth node K24 and the fifth node K25. Also, a fifth NMOS transistor N25 the gate of which is connected the connecting point of the first resistor R1 and the first NMOS transistor N21 is connected between the fifth node K25 and the ground node Vss.

Further, a transfer means 300 is connected between the fourth node K24 and the output terminal VOUT, wherein the transfer means 300 includes a first delay means I17 and I18, a fourth inverter 24 consisted of a transfer transistor T1 and a latch, and a nineteenth inverter I19 being the fifth inverter.

In the fourth inverter 24, the transfer transistor T1 is connected between the first delay means 27 and the seventh node K27. The transfer transistor T1 is consisted of a NMOS transistor and a PMOS transistor, wherein the gate of the NMOS transistor is connected to the sixth node K26 and the gate of the PMOS transistor is connected to the inverter I1 for level-shifting the voltage level of the sixth node K26. A latch circuit is connected between the seventh node K27 and the output terminal, wherein the latch circuit includes a pair of inverters I2 and I3 connected in parallel.

The output of the voltage detector 23 is feedbacked to the eighth node K28 via the second delay means (feedback means 28). The third delay means 25 is connected between the eighth node K28 and the sixth node K26.

In the third delay means 25, the fourth inverter I4 is connected between the eighth node K28 and the ninth node K29, which inverts the voltage level of the fourth node K24 that is delayed in a given time by the ninth to the twelfth inverters I9 to I12. Also, a capacitor C21 consisted of NMOS transistors is connected between the ninth node K29 and the ground terminal Vss. The fifth inverter I5 is connected between the ninth node K29 and the sixth node K26, and the second capacitor C22 is connected between the sixth node K26 and the ground terminal Vss.

Also, a second bootstrap circuit 29 is connected between the eighth node K28 and the fourteenth node K34, and a twelfth and twenty first inverters I20 and I21 are connected between the fourteenth node K34 and the tenth node K30.

In the power reset circuit constructed as above, upon a power-up, the tenth node K30 is raised to a high level by the first bootstrap circuit 21, and the latch means 300 latches the voltage level of the tenth node K30. The voltage detector operates depending on the output of the latch means 200, that is it outputs a high level or a low level signal depending on the supply voltage. Meanwhile, upon a power-up, the voltage level of the fourteenth node is made to a high level by the second bootstrap circuit 29, and the third delay means 25 delays and outputs the voltage level of the fourteenth node K34. The transfer means 300 operates depending on the output of the third delay means 25, and the voltage detector 23 transfers it to the output terminal. Also, the output of the voltage detector 23 is feedbacked to the tenth node K30 and the fourteenth node K34 by the second delay means (feedback means 28).

The operation of which will be explained below.

Upon a power-up when the supply voltage is applied, the tenth node K30 is made a high level by the bootstrap operation of the first bootstrap circuit 21. The voltage level of the tenth node K30 is made a low level via the thirteenth to fifteenth inverters I13 to I15 being the fist inverter 26 and is then inputted to the second inverter 22. As the voltage level of the first inverter 26 is inverted via the second inverter 22 and is made a low level via the sixteenth inverter I16 being the third inverter, the voltage level of the first node K21 becomes a low level.

In the second inverter 22, the voltage of the eleventh node K31 is inverted via the sixth inverter I6 to turn off the fourth PMOS transistor P24, while tuning on the sixth NMOS transistor N26. This is outputted as a high level via an inverting latch consisted of a pair of inverters I7 and I8.

If the first node K21 becomes a low level, the voltage detector 23 will operate. The voltage detector 23 is constructed so that it outputs a high voltage if it is less than a given voltage but outputs a low voltage if it is more than a given voltage. As the first node K21 is at low level, the first PMOS transistor P21 is turned on so that it can apply a supply voltage the voltage level of which is raised more than a given level. Thereby, the second node K22 becomes a high level. However, as the voltage level of the second node K22 is not so high enough to turn on the NMOS transistor, the first, second, third and fifth NMOS transistors N21, N22, N23 and N25 the gates of which are connected to the second node K22 will be kept turned off. Also, the second and the third NMOS transistors N22 and N23 will be kept turned off. On the other hand, as the voltage level of the third node K23 is kept at low level, the second and third PMOS transistors P22 and P23 will be turned on and the fourth node K24 being the output terminal of the voltage detector 23 will be kept at high level.

Meanwhile, upon a power-up, the fourteenth node K34 becomes a high level by the bootstrap operation of the second bootstrap circuit 29. Therefore, the eighth node K28 will have a high level and the third delay means 25 will delay and output the voltage level of the eighth node K28. To explain more particularly, the voltage level of the eighth node K28 causes the voltage level of the ninth node 29 to be low via the fourth inverter I4, but the first capacitor C21 will not be charged. The voltage level of the ninth node K29 is again inverted via the fifth inverter I5 to make the sixth node 26 high, and thus while the second capacitor C22 is charged, the output level of the third delay means 25 is delayed by a given time.

The transfer means 300 operates depending on the output of the third delay means 25. As the sixth node K26 is at high level, the output voltage of the first delay means 27 is passed via the transfer transistor T1 to make the seventh node K27 high. This is latched into a low level by the latches I2 and I3 and is inverted via the nineteenth inverter I19 being the fifth inverter to become a high level, thus it is passed to the output terminal VOUT. When the output terminal VOUT becomes a high level, the elements within the flash memory are reset (initialized). Also, the output of the voltage detector 23 is feedbacked to the fourteenth node K34 via the second delay means (feedback means 28).

If the supply voltage becomes a given level, the second node K22 of the voltage detector 23 becomes a high voltage, which is a high voltage enough to turn on the first, second, third and fifth NMOS transistors N21, N22, N23 and N25. Therefore, a current is passed from the supply terminal Vcc to the ground terminal Vss, which causes the fourth node K24 being the output terminal of the voltage detector 23 to be a low voltage. The output voltage of the voltage detector 23 is feedbacked to the fourteenth node K34 via the second delay means (feedback means 28) and is simultaneously passed to the transfer means 300. By the feedback operation of the second delay means 28, as the eighth node K28 has a low voltage, the sixth node K26 being the output node of the third delay means 25 will become a low voltage, and the transfer transistor T1 will not operate. Therefore, a low voltage is outputted to the output terminal VOUT to complete the initialization of tle device. The third delay means 25 is designed to have enough a latch time so that it can sufficiently delay the output value of the first delay means 27 in the third inverter 24.

Meanwhile, as the eighth node K28 is maintained at a low voltage, the tenth node K30 will become a low voltage. The voltage level of the tenth node K30 is latched and inverted via the latch means 200 and is then passed to the first node K21 At this time, the voltage level of the first node K21 becomes a high state. The first node K21 is the input terminal of the voltage detector 23 which it will not stop its operation as it reach a high voltage state. All the current within the voltage detector 23 is passed to the ground terminal Vss and thus any driving current will not flow on FIGS. 3 and 4 are graphs for illustrating the output voltages of each of the nodes depending on the power-up time of the power reset circuit according to the present invention.

Figure 3:
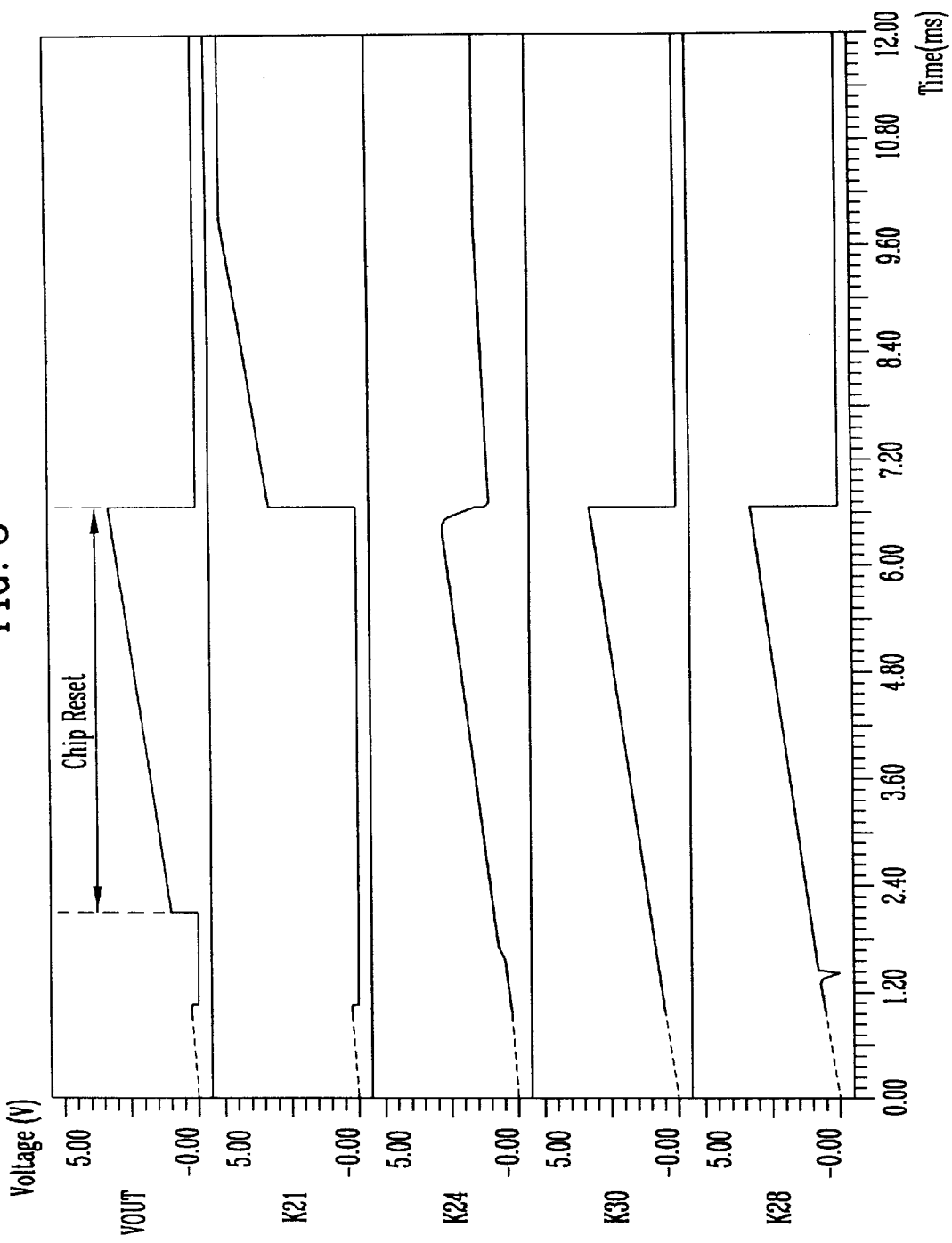
FIGS. 3 and 4 are graphs for illustrating the output voltages of each of the nodes depending on the power-up time of the power reset circuit according to the present invention.
Figure 4:
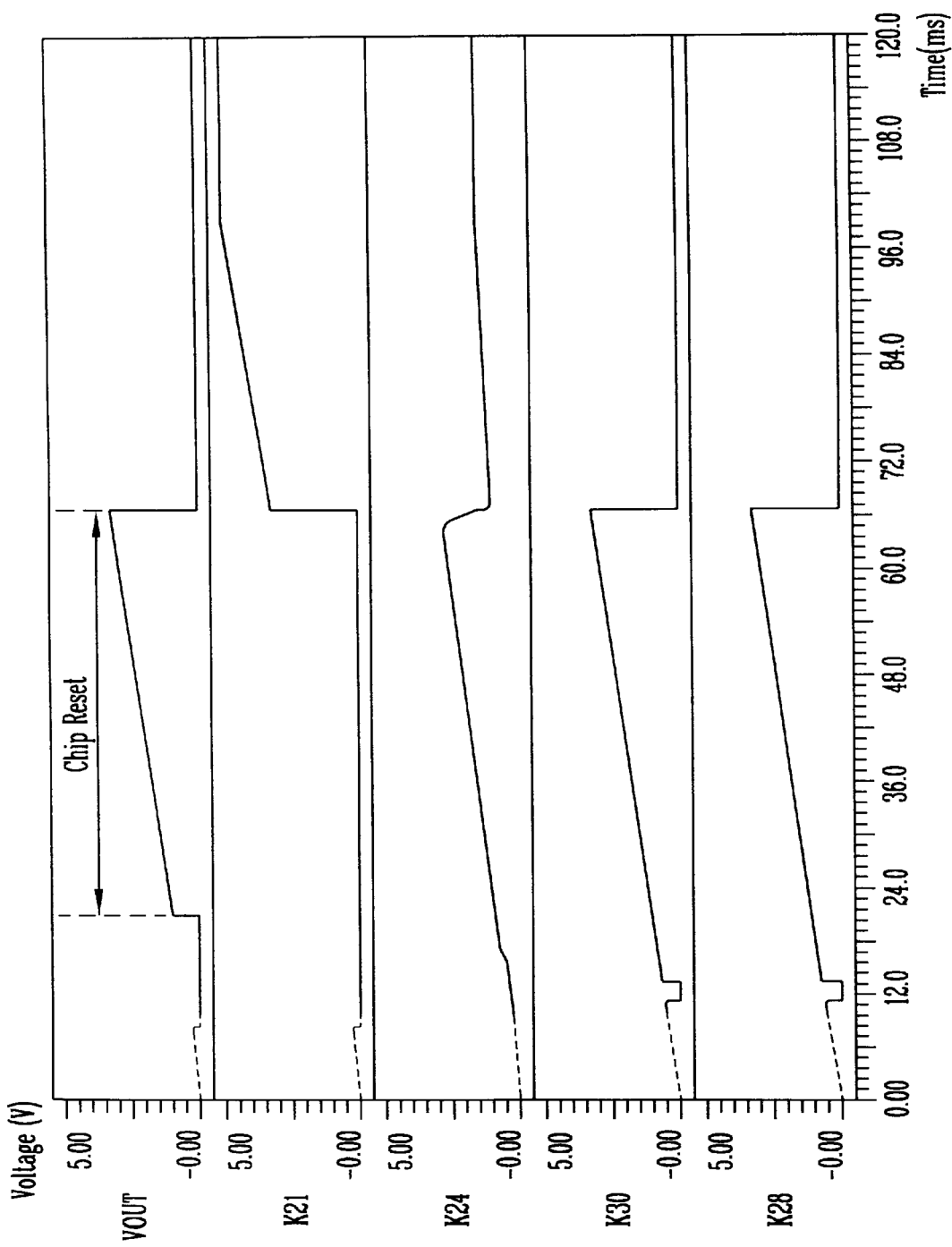

FIG. 3 shows the case where the power-up time is 10 ms, and FIG. 4 shows the case where the power-up time is 100 ms. As can be seen from the graph, with the use of the power reset circuit, the output voltage can be maintained for a given time period even when the power-up time is long enough. Thus, the initialization of the device can be stabled performed even when the power-up time is long enough.

As described above, according to the present invention, it can provide the advantages that it can remove the standby current by feedbacking the output value of the power reset circuit, and also can reduce the layout area of the power reset circuit, thus improving the integration degree of the device While the present invention has been described and illustrated herein with reference to the preferred embodiment thereof, it will be understood by those skilled in the at that various changes in form and details may be made therein without departing from the spirit and scope of the invention.

What is claimed is:

1. A power reset circuit of a flash memory device, comprising:

a first bootstrap circuit for raising the voltage level of a first node into a higher level upon a power-up;

a latch means for inverting the voltage level of said first node a voltage detector operable depending on the output of said latch means, for outputting a low level or a high level of signal depending on the level of the supply voltage;

a second bootstrap circuit for raising the voltage level of a second node into a higher level upon a power-up;

a delay means for delaying and outputting the voltage level of said second node;

a transfer means operable depending on the output of said delay means, for transferring the output of said voltage detector; and a feedback means for feedbacking the output of said voltage detector to said first node and said second node.

2. A power reset circuit of a flash memory device as claimed in claim 1, wherein said first and second bootstrap circuits each are consisted of capacitors.

3. A power reset circuit of a flash memory device as claimed in claim 1, wherein said latch means comprises a first inverting means consisted of a plurality of inverters, a second inverting means for selectively latching any one of the supply voltage and the output voltage of said first inverting means depending on the output signal of said first inventing means, and a third inventing means for inventing the output of said second inventing means.

4. A power reset circuit of a flash memory device as claimed in claim 1, wherein said voltage detector includes a first PMOS transistor for controlling the output of the supply voltage depending on the output of said third inverting means, a first NMOS transistor connected between said first PMOS transistor and the ground terminal and operable as a first resistor and a diode, a second NMOS transistor and a second resistor serially connected between said first PMOS transistor and the ground terminal and operable as a diode, and a current mirror circuit connected between said first PMOS transistor and the ground terminal, for comparing the supply voltage lowered by said first resistor and the voltage lowered by said second NMOS transistor.

5. A power reset circuit of a flash memory device as claimed in claim 1, wherein said delay means includes a first inverter for inverting the voltage level of said second node, a first capacitor for delaying the output signal of said first inverter for a given time period, a second inverter for inverting the output signal of said first inverter, and a second capacitor for delaying the output signal of said second inverter for a given time period.

6. A power reset circuit of a flash memory device as claimed in claim 1, wherein said transfer means includes a first delay means consisted of a plurality of inverters, a fourth inverting means for inverting and delaying the output signal of said transfer transistor operable depending on the output of said delay means, and a fifth inverting means for inventing the output of said fourth inventing means.

7. A power reset circuit of a flash memory device as claimed in claim 1, wherein said feedback means is consisted of a plurality of inverters.

8. A power reset circuit of a flash memory device as claimed in claim 1, further comprising a delay circuit connected between said first node and said second node.

9. A power reset circuit of a flash memory device as claimed in claim 8, wherein said delay circuit is consisted of a plurality of inverters.

\* \* \* \* \*